(12) United States Patent
Hendriks et al.

(10) Patent No.: US 6,977,461 B2
(45) Date of Patent: Dec. 20, 2005

(54) SYSTEM AND METHOD FOR MOVING AN OBJECT EMPLOYING PIEZO ACTUATORS

(75) Inventors: Stefan Gertrud Marie Hendriks, Eindhoven (NL); Thomas Augustus Mattaar, Veldhoven (NL); Gerardus Jacobus Cornelis Catharina Maria Leenheers, Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 65 days.

(21) Appl. No.: 10/735,605

(22) Filed: Dec. 15, 2003

(65) Prior Publication Data
US 2005/0127786 A1    Jun. 16, 2005

(51) Int. Cl.[7] ............................................. H01L 41/08
(52) U.S. Cl. ................. 310/328; 310/317; 310/316.01; 310/333; 310/323.02
(58) Field of Search ........................... 310/316.01, 317, 310/328, 333, 323.02

(56) References Cited

U.S. PATENT DOCUMENTS

| | | | | |
|---|---|---|---|---|
| 5,089,740 A | * | 2/1992 | Ono | 310/328 |
| 5,136,201 A | * | 8/1992 | Culp | 310/328 |
| 5,939,816 A | * | 8/1999 | Culp | 310/328 |
| 6,150,750 A | * | 11/2000 | Burov et al. | 310/328 |
| 6,153,991 A | * | 11/2000 | Burov et al. | 310/320 |
| 6,239,533 B1 | * | 5/2001 | Burov et al. | 310/328 |
| 6,337,532 B1 | * | 1/2002 | Johansson et al. | 310/323.02 |
| 6,798,117 B2 | * | 9/2004 | Johansson et al. | 310/323.02 |
| 6,838,808 B2 | * | 1/2005 | Tanaka | 310/328 |

* cited by examiner

*Primary Examiner*—Mark Budd
(74) *Attorney, Agent, or Firm*—Pillsbury Winthrop Shaw Pittman LLP

(57) ABSTRACT

A piezo actuator system, is presented herein. A piezo actuator system comprises a number of piezo actuators which may lengthen and shear. Using the lengthening and shearing, the piezo actuator system grips and moves an object in response to a first and a second control signal, respectively. The possible displacement of the object is limited by the maximum shear of the piezo actuators. To increase the possible displacement, the piezo actuators may be controlled to perform a linear shear sequence or a shuffle sequence. During the linear shear sequence, the object is moved; during the shuffle sequence the object is substantially stationary, while the piezo actuators are repositioned with respect to the object, after which the object may be moved further using the linear shear sequence.

A piezo actuator system may be adapted to perform a slow shuffle sequence, being a relatively slowly performed shuffle sequence, during which the linear shear sequence may be performed simultaneously, preventing any dead time during movement.

26 Claims, 3 Drawing Sheets

I                II

SYSTEM AND METHOD FOR MOVING AN OBJECT EMPLOYING PIEZO ACTUATORS

BACKGROUND OF THE INVENTION

1. Field of the Invention

The present invention relates to a system and method for moving an object using piezo actuators and, more particularly, to a system for moving an object associated with lithographic apparatus.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a lithographic apparatus, a system for moving an object using piezo actuators may be employed to move objects, such as a lens element or a mirror used for controlling a position and angle of an exposure laser beam. A "piezo" material is a known material that deforms in response to a voltage or charge. Different types of piezo materials exist. For example, one type of piezo material changes in length while other types shear in response to an applied control signal. Hereinafter, piezo materials that either increase or a decrease in length will be referred to as a "lengthening piezos", while piezo materials that shear will be referred as a "shearing piezos."

The change in length or the shear distance is substantially linear relative to a charge supplied by the applied control signal, if no external load is present. An object attached or connected to the piezo actuator, i.e. an external load, moves with the piezo material. The lengthening or shearing of the piezo material is limited. Therefore, an object may only be moved over a relatively small distance when using a linear mode of the piezo actuator.

To increase the range for moving an object, it is known to combine the above-mentioned piezo types in order to create piezo actuator that can both lengthen and shear. With a number of such piezo actuators and a suitable sequence of lengthening and shearing, an object may be moved in a certain direction over a greater distance.

For example, using a number of piezo actuators adapted to lengthen and shear, it is possible to engage an object. Then, in a first step of the sequence, a first actuator releases the object by contracting away from the object and, in a second step, the first actuator shears to the left, while the second actuator, still engaging the object, shears to the right taking the object along with it. In a third step, the first actuator engages the object again by expanding, while remaining in its sheared state.

A second actuator releases its engagement with the object by contracting, while remaining in its sheared state. Next, in a fourth step, the first actuator shears to the right, back to its original state taking the object along with it. The second actuator also shears back to its original state. In a fifth step, the second actuator engages the object again by expanding. After the fifth step, both piezo actuators are back in their original relaxed state. The object, however, has been moved twice to the right and has thus moved twice a predefined, possibly maximum, shear distance of a single piezo actuator. The sequence may be repeated any number of times until the object reaches its target position. Hereinafter, the sequence will be referred to as a stepping sequence or stepping mode.

It is a disadvantage of the stepping mode that even for small moves, the piezo actuators need to contract and expand. The lifetime of the piezo actuators depends on the number of contractions or shears. Thus, the lifetime of the piezo actuators is reduced by contracting and expanding for small moves whereas only shearing could suffice. However, as mentioned above, the range for moving an object in a linear mode is very small.

SUMMARY OF THE INVENTION

Principles of the present invention, as embodied and broadly described herein, provide a piezo actuator system for moving an object. In one embodiment, the piezo actuator system is configured to perform at least two sequences: a linear shear sequence and a shuffle sequence. The linear shear sequence includes engaging the object using at least one piezo actuator and moving the object by shearing said at least one piezo actuator. The shuffle sequence includes releasing the engagement of a first piezo actuator with the object, changing a shear state of said first piezo actuator, and engaging the object again using said first actuator.

In one embodiment, the piezo actuator system moves an object primarily using the linear mode of a piezo actuator. The piezo actuator engages the object and shears. The object may thus be displaced over a maximum distance corresponding to the maximum shear distance of the piezo actuator. The piezo actuator does not contract and expand for moving the object within the shearing range of the piezo actuator. Without contracting and expanding, i.e. lengthening, for moving an object over a distance within the shearing range of the piezo actuators, the lifetime of the piezo actuators is substantially increased.

However, an object may be needed to be moved over a distance outside the shearing range of the actuators. Accordingly, the piezo actuator system may alternate the linear shear sequence and a shuffle sequence. When the piezo actuators have reached their maximum, or any other predetermined shear, the shuffle sequence is performed. During the shuffle sequence the object does not substantially move, but the piezo actuators are brought in a state wherein they may shear again in the direction wherein the object should be moved.

A piezo actuator may engage the object by just lifting the object. Due to friction between the piezo actuator and the object, the object moves with the piezo actuator when it shears. Engagement of the object by the piezo actuator should be interpreted broadly to mean that the piezo actuator interacts with the object such that when the piezo actuator shears, the object moves along with the piezo actuator.

It is to be noted that the present invention may be employed with any piezo actuator system, wherein the piezo actuators may exert a force on an object in a first direction for moving the object in the first direction and in a second direction, preferably substantially perpendicular to the first direction, for engaging said object. For example, in one embodiment, a piezo actuator is formed by two piezo sub-actuators positioned opposite to each other, and the object is engaged through clamping the object between the two piezo sub-actuators. The sub-actuators engage the object together and move it in the desired direction. Such an embodiment of the piezo actuators ensures a good engagement of the actuator with the object.

In another embodiment, an object may be engaged by the piezo actuators while they are in a relaxed state. In such an embodiment, the piezo actuators may be pushed against the object by a spring. To release the engagement of one piezo actuator, said actuator contracts, while another actuator expands.

The shuffle sequence noted above, may be used to enlarge the range of the system for moving the object. Moving of the object is performed during the linear shear sequence. When the maximum or a predetermined displacement distance by the linear shear is reached, the shuffle sequence brings the piezo actuators back into a state where they may shear again in the desired movement direction. During the shuffle sequence, while the piezo actuators shear in a direction opposite to the desired movement direction, the object stays in its position. After the shuffle sequence, the linear shear sequence may move the object further into the desired movement direction. Thus, alternating the linear shear sequence and the shuffle sequence the object may be moved over any arbitrary distance.

The shuffle sequence starts with releasing the engagement of a first piezo actuator. A second piezo actuator may keep engaging the object. Since the second piezo actuator keeps engaging, the object is kept in place. The first actuator contracts, moving away from the object, and thus releases its engagement. Essentially, after releasing its engagement, the piezo actuator may shear without moving the object.

After release of its engagement, the piezo actuator shears back from its predetermined maximum shear to a state wherein it is relaxed or it may shear past its relaxed state into the opposite direction increasing its maximum shearing distance during the next linear shear sequence. Then, it expands and engages the object again. As soon as the first piezo actuator has engaged the object again, the second piezo actuator performs the same sequence as the first: it releases its engagement, shears back to its relaxed state or past its relaxed state into the opposite direction and engages the object again. While the second piezo actuator performs the shuffle sequence, the first piezo actuator keeps engaging the object. Thus, both piezo actuators have created additional shear range without moving the object.

It is to be noted that above the sequences have been described with reference to a system having two piezo actuators adapted for lengthening and shearing. In practice, a system may have any number of piezo actuators. If more than two piezo actuators are present, the above shuffle sequence may be performed for each piezo actuator, one after the other, or all the piezo actuators may be organized in a number of groups, e.g. two groups, and the sequence may be performed one group after the other.

Further, in the above-described system, the object is fully supported by the piezo actuators requiring that the shuffle sequence is performed in two stages. In each stage one or more piezo actuators keeping their engagement and thus supporting the object, while one or more other piezo actuators shear back. However, in a specific embodiment, there may be provided a number of supports that may support the object, while all piezo actuators shear back at the same time.

When the piezo actuators engage the object again, the object is lifted from the supports and is fully supported by the piezo actuators again. In a further embodiment, the object may not even be supported by the actuators during movement, but by any other kind of support means, thus the object being engaged and moved by the actuators while being supported by the other support means.

The control system may be configured as a position control system. A position controller, such as a PID-controller, may generate a controller force signal based on an input signal representing a desired movement. The controller force signal is fed to an actuator input. The actuator moves the object corresponding to the controller force signal. A sensor system determines the actual position of the object simultaneously. The actual position is subtracted from a set target position. The resulting desired movement is used as the controller input signal.

To perform the shuffle sequence and to alternate the linear shear sequence and the shuffle sequence the control system may be provided with a shuffle controller. The shuffle controller receives the controller force signal. The shuffle controller translates the controller force signal into corresponding first and second actuator control signals.

Further, the shuffle controller detects when the actuator reaches or approaches its maximum, or a predetermined shear. When the maximum shear is detected, the shuffle controller switches the position controller open-loop by supplying a shuffle event signal to the position controller and thus the controller force signal is disconnected. The shuffle controller then outputs a sequence of first and second actuator control signals according to the shuffle sequence. After completing the shuffle sequence the controller force signal is connected again and the system continues to perform the linear shear sequence.

The shuffle controller may comprise a shuffle arbiter for determining when a shuffle sequence is to be performed, and a profile generator for generating the first and second actuator control signals and the shuffle event signal. For example, the shuffle arbiter may evaluate the second actuator control signal for each actuator during the linear shear sequence. The second actuator control signal is a measure for the total shear of the actuator. When the signal exceeds a predetermined limit, the shuffle arbiter instructs a shuffle sequence.

Further, the profile generator may be provided with a number of system parameters and store any preprogrammed sequence or a number of preprogrammed sequences. Based on the parameters and the preprogrammed sequence steps, the profile generator may generate the first and second actuator control signals and the shuffle event signal.

The shuffle sequence as described above is performed as quickly as possible since the object does not substantially move during the shuffle sequence resulting in a dead time. In a further embodiment of the present invention, the system is further adapted to perform a slow shuffle sequence wherein the shuffle sequence is performed relatively slowly, and during which the linear shear sequence may be performed simultaneously, thus preventing any dead time during actuation.

During the shuffle sequence the object does not substantially move since the position controller has to be switched open-loop, i.e. disconnected from the actuator. This disconnection is needed to ensure a stable control system, since the transition from the linear shear sequence to the shuffle sequence could result in a jump in the second control signal and since large disturbance forces could arise during the shuffle sequence. During the slow shuffle sequence the position controller does not need to be switched open-loop, but is kept closed-loop. Thus, the position controller keeps controlling the piezo actuators to move the object, while the piezo actuators are also controlled to shuffle. The actuation maybe continued during the slow shuffle sequence, since at least a number of the piezo actuators is engaging the object during the slow shuffle control and generated disturbance forces are smaller compared to the ones generated during the shuffle sequence.

To ensure a smooth transition from the linear shear sequence to the slow shuffle sequence, the control system may comprise an integrator into which the controller force signal is input. The integrator is reset in response to a shuffle start control signal, when the slow shuffle sequence is started, and an output of the integrator is added to the second control signal. Since the integrator is positioned between the controller force signal and the second control signal, the position control system should be adapted for this extra integrator.

When the slow shuffle sequence is started, a shuffle start control signal is provided to the integrator. In response to this shuffle start control signal, the integrator resets its output to zero. During the slow shuffle sequence, the second control signal is the sum of the controller force signal and a shuffle control signal. At the start of the slow shuffle sequence, the value of the second control signal is copied to the second shuffle control signal. Then, the integrator is reset as mentioned above, setting its output to zero. Thus, the second control signal being a sum of the second shuffle control signal and the integrator output is kept substantially the same when starting the slow shuffle sequence, providing a smooth transition to the slow shuffle sequence.

During the slow shuffle sequence, the second shuffle control signal is gradually decreased to zero and the integrator output may increase. When the second shuffle control signal is decreased to zero, the slow shuffle sequence has ended and the integrator output forms the second control signal, providing a smooth transition from the slow shuffle sequence to the linear shear sequence.

According to another embodiment of the present the invention, there is provided a lithographic apparatus comprising an illumination system configured to provide a projection beam of radiation, a support structure configured to support a patterning device, the patterning device serving to impart the projection beam with a pattern in its cross-section, a substrate table configured to hold a substrate, a projection system configured to project the patterned beam onto a target portion of the substrate, and a piezo actuator system for moving a lens element or a mirror.

According to a further aspect of the invention, there is provided a method for moving an object using a number of piezo actuators, the piezo actuators being adapted for lengthening in response to a first control signal, and for shearing in response to a second control signal, the method comprising a linear shear sequence and a shuffle sequence. The linear shear sequence comprising engaging the object using at least one piezo actuator and moving the object by shearing said at least one piezo actuator. The shuffle sequence comprising releasing the engagement of a first piezo actuator with the object, changing a shear state of said first piezo actuator, engaging the object again using said first actuator.

According to a further aspect of the invention, there is provided a device manufacturing method comprising providing a substrate, providing a projection beam of radiation using an illumination system, using a patterning device to impart the projection beam with a pattern in its cross-section, projecting the patterned beam of radiation onto a target portion of the substrate, and moving a lens element or a mirror using the method according to present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate maybe processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Projection Apparatus

Figure 1:
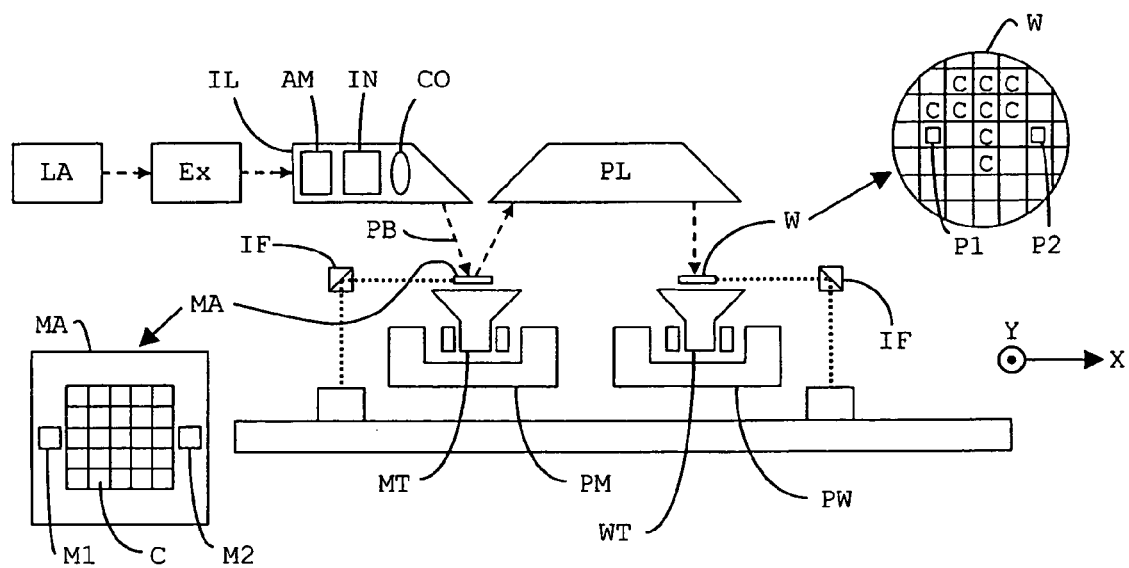
FIG. 1 depicts a lithographic apparatus according to an embodiment of the invention.

FIG. 1 schematically depicts a lithographic projection apparatus according to a particular embodiment of the invention. The apparatus comprises:

a radiation system Ex, IL: for supplying a projection beam PB of radiation (e.g. UV radiation such as for example generated by an excimer laser operating at a wavelength of 248 nm, 193 nm or 157 nm, or by a laser-fired plasma source operating at 13.6 nm). In this particular case, the radiation system also comprises a radiation source LA;

a first object table (mask table) MT: provided with a mask holder for holding a mask MA (e.g. a reticle), and connected to first positioning mechanism PM for accurately positioning the mask with respect to item PL;

a second object table (substrate table) WT: provided with a substrate holder for holding a substrate W (e.g. a resist-coated silicon wafer), and connected to second positioning mechanism PW for accurately positioning the substrate with respect to item PL; and a projection system ("lens") PL: (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning mechanism, such as a programmable mirror array of a type as referred to above.

The source LA (e.g. a UV excimer laser, a laser-fired plasma source, a discharge source, or an undulator or wiggler provided around the path of an electron beam in a storage ring or synchrotron) produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW (and interferometric measuring mechanism IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan.

In general, movement of the object tables MT, WT will be realized with the aid of a long-stroke module and a short-stroke module, which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Embodiment 1

FIG. 2 illustrates possible types of piezo material usable as actuators. FIG. 2a (I) shows a piece of lengthening piezo material 2 positioned on a base material 8. A control signal, i.e. a voltage, may be supplied to the lengthening piezo material 2. In response to the control signal (II), the piece of piezo material 2 expands (or contracts), and contracts (or expands, respectively) when the control signal is removed.

Figure 2A:
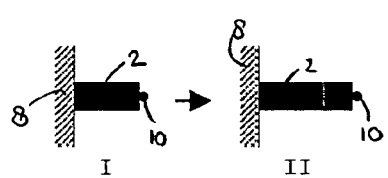
FIGS. 2a and 2b schematically illustrate a piezo actuator capable of lengthening and capable of shearing, respectively.
Figure 2B:
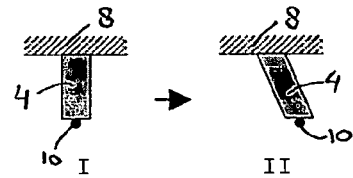

FIG. 2b (I) illustrates a piece of shearing piezo material 4 positioned on a base material 8. When a control signal, i.e. a voltage, is supplied to the piezo material 4 (II), the piezo material 4 shears left or right and returns to its original position when the control signal is removed.

An object 10 attached to the piezo material 2, 4 moves with the lengthening or shearing of the piezo material 2, 4. The maximum displacement is limited by the maximum expansion or shear of the piezo material 2, 4. Usually, this is only a small displacement and is not sufficient for an actuator.

Figure 2C:
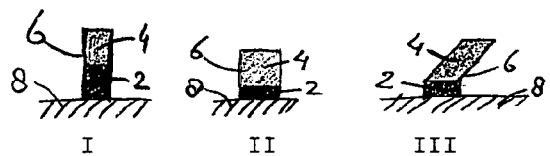
FIG. 2c schematically illustrates an piezo actuator capable of lengthening and shearing.

A piezo actuator 6 as shown in FIG. 2c (I) comprises a piece of lengthening piezo material 2 and shearing piezo material 4. The piezo actuator is positioned on a base material 8. On both pieces of piezo material 2, 4 a voltage may be separately applied. Thus, as shown in FIG. 2c (II) and (III), the actuator 6 may lengthen in response to a first control signal and may shear in response to a second control signal, and may lengthen and shear simultaneously in response to the first and second control signal.

Second Embodiment

Figure 2D:
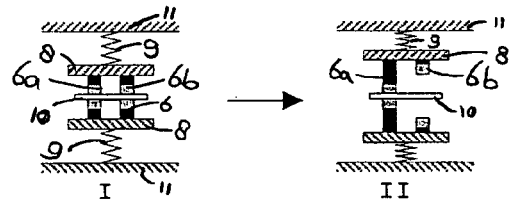
FIGS. 2d and 2e schematically illustrate embodiments of a piezo actuator system in accordance with an embodiment of the present invention.

FIG. 2d (I) illustrates an embodiment of an actuator comprising four piezo actuators 6 as shown in FIG. 2c. An object 10 is engaged by said four piezo actuators 6. The piezo actuators 6 are positioned on a base material 8. The base material 8 is attached to a reference system 11 using springs 9. When no control signal is supplied to the piezo actuators 6, i.e. the piezo actuators 6 are relaxed (I), the object 10 is engaged by the piezo actuators 6 as a result of the spring load. To release the engagement with the object 10, a first piezo actuator 6a may expand while a second piezo actuator 6b contracts, as illustrated in FIG. 2d (II). Thus, the first piezo actuator 6a grips the object 10, while the second piezo actuator 6b releases its engagement.

Third Embodiment

Figure 2E:
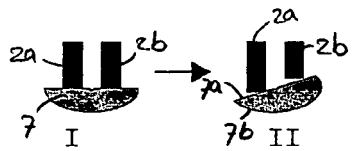

FIG. 2e (I) shows another embodiment of a piezo actuator system for moving an object 10. The piezo actuator system comprises two lengthening piezo actuators 2a and 2b, and a semi-circular friction element 7. A flat surface 7a of the friction element 7 is positioned against the piezo actuators 2a and 2b. A convex surface 7b of the friction element 7 may engage an object. As shown in FIG. 2e (II), by expanding one piezo actuator 2a and possibly contracting another piezo actuator 2b, the friction element 7 rotates over a predetermined angle. When the friction element 7 is positioned with its convex surface 7b against an object 10, the object 10 will move due to friction between the friction element 7 and the object 10. Contracting both piezo actuators 2a and 2b releases the engagement of the friction element 7 with the object 10.

It is noted that in the embodiment shown in FIG. 2e, the piezo actuator system lengthens when both piezo actuators 2a and 2b contract or expand. Thus, both piezo actuators 2a and 2b contract or expand in response to the first control signal. In response to the second control signal, one piezo actuator 2a contracts (or expands) and another piezo actuator 2b expands (or contracts, respectively) resulting in shearing of the convex surface 7b of the friction element 7. The piezo actuator system may thus replace one piezo actuator 6 as shown in FIG. 2c.

Fourth Embodiment

Figure 3:
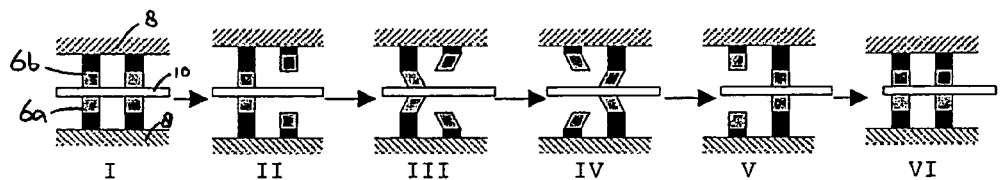
FIG. 3 illustrates a prior art sequence for moving an object using piezo actuators.

FIG. 3 illustrates a prior art system comprising a number of piezo actuators 6, in this case two, for moving an object 10 over a larger distance than the maximum lengthening or shearing of a single piezo actuator 6. In the system shown in FIG. 3, the piezo actuators 6 comprise two sub-actuators 6a, 6b which are positioned opposite to each other. The actuators 6 grip the object 10 by clamping the object 10 between the two sub-actuators 6a and 6b (I).

In a first step (II) to move the object 10, one of the actuators 6 releases its engagement with the object 10 by contracting away from the object 10. Then, in a second step (III), the actuator 6 still engaging the object 10 shears in a desired movement direction, for example right, while the other actuator 6, still contracted, shears opposite to the movement direction, e.g. left. The actuator 6 engaging the object 10 and shearing in the direction of movement takes the object 10 along, and thus the object 10 moves in the desired direction over a predetermined shearing distance of the actuator 6.

In a third step (IV), the actuator 10 contracted away from the object 10 engages the object 10 again by expanding while said actuator 6 maintains its shear state. As soon as the actuator 6 engages the object 10, the other actuator 6 having reached its maximum shear distance in the direction of movement, releases the object 10 by contracting. Next, in a fourth step (V), both actuators 6 shear back to their original, in this case straight, position. Again, the actuator 6 engaging the object 10 takes the object 10 along in the direction of movement. The object 10 thus moves again over a predetermined shearing distance of the actuator 6 in the direction of movement. In a fifth step (VI), the contracted actuator 6 expands and engages the object 10 again.

The actuators 6 have then reached their original state, i.e. the same lengthening and shearing state they had before the first step of the moving sequence. The object 10, however, has been moved two steps in the desired direction. Since the piezo actuators 6 have reached their original position, the sequence may be repeated any number of times moving the object 10 in the desired direction of movement over any distance. However, it is noted, that the actuators 6 have to lengthen and shear for every displacement of the object 10, even for displacements of the object 10 smaller than the maximum shearing distance of the actuators 6. Releasing and engaging again results in disturbance forces and decreases the accuracy of the positioning and is therefore a disadvantage of the sequence. Further, since each contraction or expansion of the actuators 6 shortens the lifetime of the actuators 6, the sequence illustrated in FIG. 3 shortens the lifetime of the actuators 6.

Figure 4A:
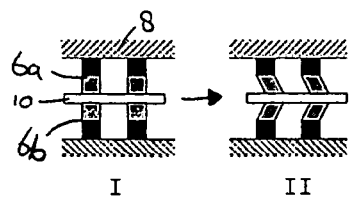
FIG. 4a illustrates the linear shear sequence according to the present invention.

FIG. 4a (I) shows a system having two piezo actuators 6 each comprising two sub-actuators 6a and 6b. However, FIG. 4a (II) shows that the actuators 6 move the object 10, different than the system of FIG. 3, according to an embodiment of the present invention. The object 10 is moved by linearly shearing of the actuators 6 engaging the object 10. No contraction or expanding is used to move the object 10. The maximum displacement is however limited as described in relation to FIGS. 2a and 2b.

Figure 4B:
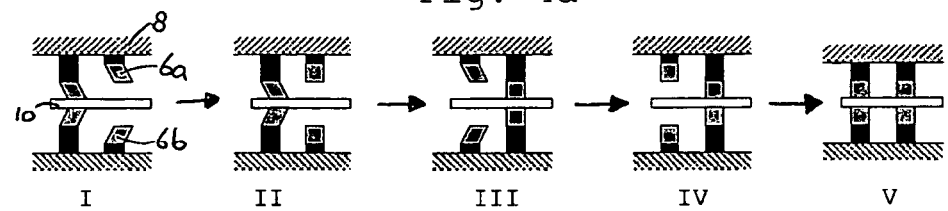
FIG. 4b illustrates the shuffle sequence according to the present invention.

FIG. 4b illustrates a shuffle sequence to bring the actuators 6 back to their original state, while keeping the object 10 substantially stationary after being moved in a desired direction of movement. In a first step (I), one of the actuators 6 releases its engagement with the object 10 and in a next step (II) it shears back to its original shear state. In a third step (III) the actuator 6 engages the object 10 again. The second actuator 6 repeats the above described three steps to return to its original state too (III, IV, V). When both actuators 6 are back in their original state, the linear shear sequence illustrated in FIG. 4a may be performed again. During the shuffle sequence the object 10 is not substantially displaced.

Alternating the linear shear sequence and the shuffle sequence enables to displace an object 10 over any arbitrary distance. It is noted that the object 10 may of course analogously be moved to the left instead of to the right as illustrated in FIGS. 3 and 4.

Fifth Embodiment

Figure 5A:
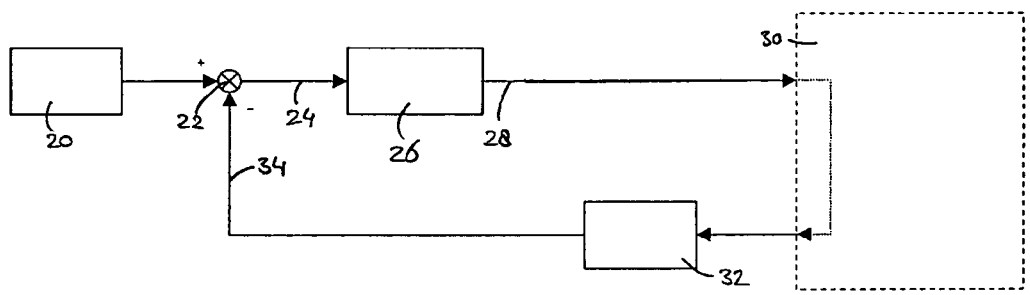
FIG. 5a illustrates a prior art position control circuit.

FIG. 5a shows a basic prior art position control circuit for controlling the position of an object. A set-point generator system 20 outputs a for an object desired position. Also, in a specific embodiment, said output position may be a continuous series of positions representing a smooth trajectory from a current position to a desired target position.

The output of the set-point generator system 20 is input into a subtractor 22. The subtractor 22 is also provided with an actual position signal 34. The actual position signal 34 represents the actual position of the object to be moved by the position control system. The actual position signal 34 is subtracted from the desired position and a position error signal 24 is output by the subtractor 22.

The position error signal 24 is input into a position controller 26. The position controller 26 is a well-known system in the art. Based on the position error signal 24, the position controller 26 determines a position controller force signal 28. The position controller force signal 28 is output to an actuator system 30. The actuator system 30 exerts a force and thus moves the object corresponding to the position controller force signal 28. For example, if the actuator system 30 is a piezo actuator system such as described in relation to FIGS. 3, 4a, and 4b, the position controller force signal 28 may represent a number of voltages supplied over a corresponding number of conducting leads, each voltage controlling each piezo actuator comprised by the actuator system 30. However, any other actuator maybe used in this position control circuit and thus the position controller force signal 28 may have any suitable form.

The actual position of the object is determined by a position sensor system 32. The position sensor system 32 may be any system suitable for and capable of determining the actual position of the object and translating the actual position into the actual position signal 34 to be input into the subtractor 22.

A person skilled in the art readily understands how the position control system shown in FIG. 5a functions. Based on a set-position and the actual position signal 34, a position error signal 24 is generated. The position controller 26 translates the position error signal 24 into a suitable position controller force 28, which controls an actuator system 30 to move the object. The actual position of the object is determined by the position sensor system 32 which supplies the actual position signal 34 to the subtractor 22, thereby regenerating the position error signal 24. When the object reaches the set-position, the position error signal 24 becomes zero. Then, the position controller force 28 set by the position controller 26 is such that the object 10 does not move anymore. Thus, the object is moved to the position set by the set-point generator system 20.

Figure 5B:
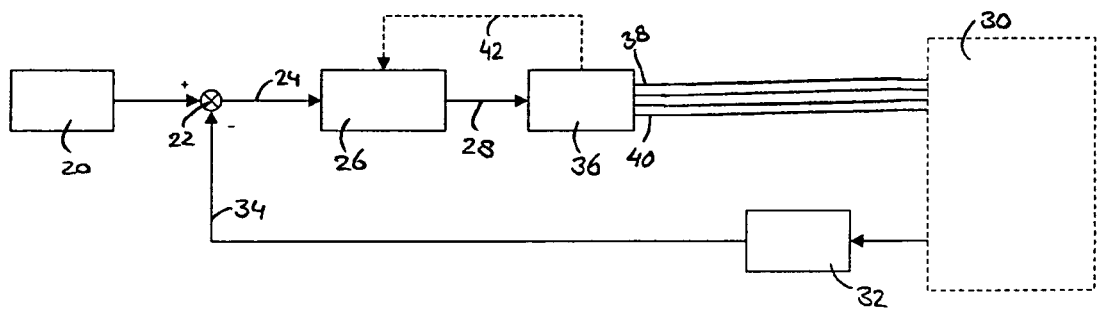
FIG. 5b illustrates a position control circuit for controlling piezo actuators in accordance with an embodiment of the present invention.

A position control circuit according to the present invention as illustrated in FIG. 5b is essentially similar to the position control circuit of FIG. 5a. However, the position control circuit of FIG. 5b further comprises a shuffle controller 36 and the actuator system 30 is a piezo actuator system. The position controller force signal 28 is input to the shuffle controller 36 and the output of the shuffle controller 36 comprises a first control signal 38 and a second control signal 40 for each piezo actuator comprised in the piezo actuator system 30. The first control signal 38 controls the lengthening of a piezo actuator and the second control signal 40 controls the shearing of a piezo actuator. Thus, the position controller force 28 is translated into the second control signal 40.

The piezo actuator system 30 moves the object according to the present invention using the linear shear sequence. To this end, there is no need for any additional system compared to the position control circuit of FIG. 5a. However, when the piezo actuators reach their maximum shear, the shuffle sequence according to the present invention needs to be performed. The shuffle controller 36 determines when the piezo actuators approach or reach their maximum shear, and starts the shuffle sequence.

The shuffle controller 36 may determine the maximum shear of the piezo actuators with any method. For example, the shuffle controller 36 may accumulate the shear of the actuators over time and compare it to a predetermined limit, or the shear may be measured directly.

When the maximum shear is detected, the shuffle controller 36 switches the position control circuit open-loop, i.e. the position controller 26 is disabled such that the position error is uncontrolled and the position controller force signal 28 is set to zero. The shuffle controller 36 disables the position controller 26 by supplying a shuffle event signal 42 to the position controller 26.

While the position control circuit is open-loop, the shuffle controller 36 outputs first and second control signals 38, 40 according to the shuffle sequence of the present invention. After the shuffle sequence the shuffle controller 36 sends a shuffle event signal 42 to the position controller 26 which in response checks the position error signal 24 again and outputs a corresponding position controller force signal 28. In specific embodiments, the position controller 26 may wait a predetermined period before resuming the output of the position controller force signal 28 to be able to settle after the shuffle sequence, during which the position controller 26 was switched open-loop. In another embodiment, the position controller 26 may wait for a third shuffle event signal 42 before resuming to output the position controller force signal 28.

Sixth Embodiment

In another embodiment of the present invention, the shuffle controller 36 is configured to perform the slow shuffle sequence. The shuffle controller 36 does not need to send a shuffle event signal 42 to the position controller 26 as the system stays closed-loop during the slow shuffle sequence. The shuffle controller 36, however, further comprises a device, such as an integrator, to ensure that the transition from the linear shear sequence to the slow shuffle sequence is smooth. This will be explained in more detail below in relation to FIG. 6b.

Figure 6A:
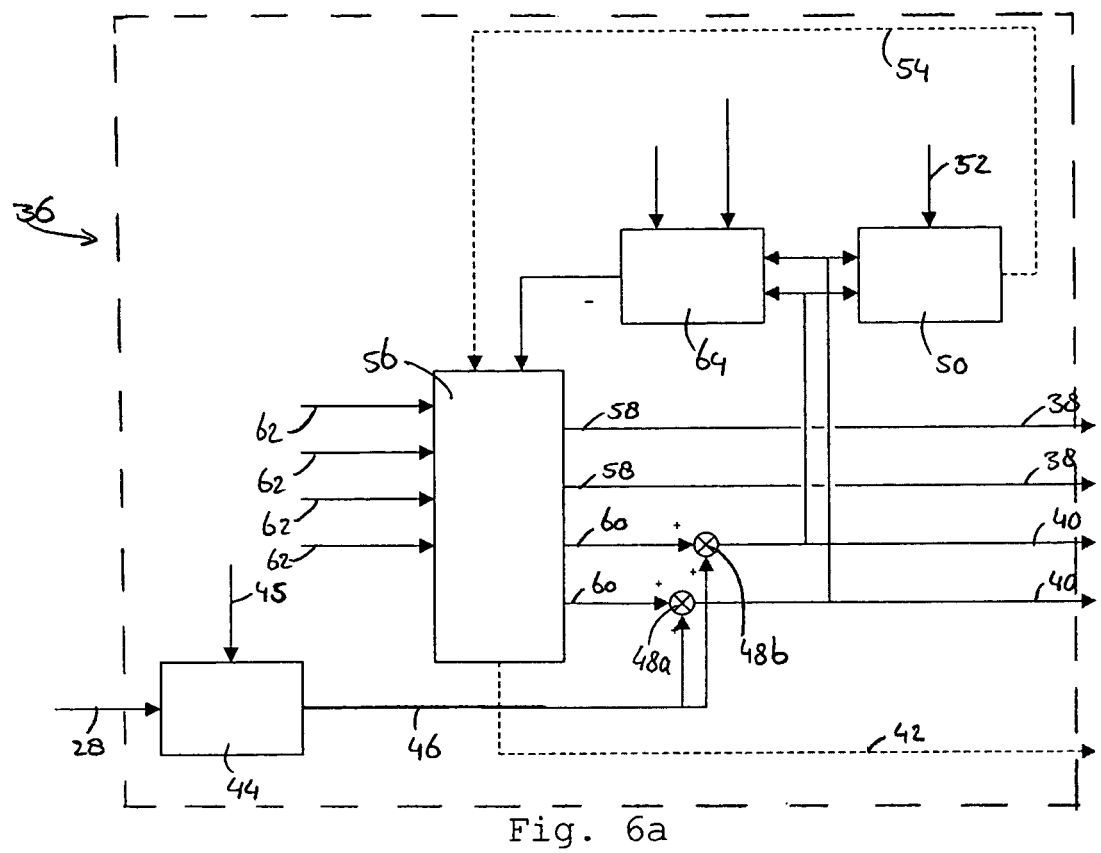
FIG. 6a illustrates a shuffle controller, i.e. a shuffle control circuit, in accordance with an embodiment of the present invention for performing the shuffle sequence.

FIG. 6a illustrates a shuffle controller 36 in more detail. The position controller force signal 28 is input into the shuffle controller 36. The position controller force signal 28 is translated into an actuator voltage 46 by a converter 44 based on a force-signal to actuator-voltage factor 45. However, the converter 44 is not an essential element of the shuffle controller 36 as the position controller force signal 28 may already be an actuator voltage 46. The actuator voltage 46 is send to two adders 48a and 48b and the output of the adders 48a, 48b are output as the second control signal 40.

In the embodiment of FIG. 6a, the second control signal 40 is detected by a shuffle arbiter 50. The shuffle arbiter 50 checks the second control signal 40, since the second control signal 40 represents the actual shear state of the piezo actuators. When the second control signal 40 exceeds a predetermined shear limit 52, i.e. the piezo actuators approach or have reached their maximum, or a predetermined shear, the shuffle arbiter 50 outputs a shuffle start signal 54.

The shuffle start signal 54 is send to a profile generator 56. The profile generator 56 outputs the first and second shuffle control signals 58 and 60. The first shuffle control signal 58 is output as the first control signal 38 and the second shuffle control signal 60 is added to the actuator voltage 46 and then output as the second control signal 40. The first and second shuffle control signals 58 and 60 are based on predetermined parameters 62 such as maximum speed, maximum engagement force and a sequence table. Further, the profile generator 56 outputs the shuffle event signal 42, which is used to enable and disable the position controller.

Further, the shuffle controller 36 is provided with a selector 64. The selector 64 may be used to select a value for a number of parameters that may differ per situation. For example, the selector may select which sequence is to be used by the profile generator 56, or a parameter determining to which shear state the piezo actuators need to return. The piezo actuators do not have to return to a shear-free state, but they may have any shear state after the shuffle sequence. For example, when the object is being moved in the direction of movement, the piezo actuators may be controlled to shear opposite to the direction of movement to a predetermined, possibly their maximum, shear during the shuffle sequence enabling a much larger displacement of the object during the subsequent linear shear sequence. The selector 64 is however not an essential element of the shuffle controller 36 according to the present invention.

Figure 6B:
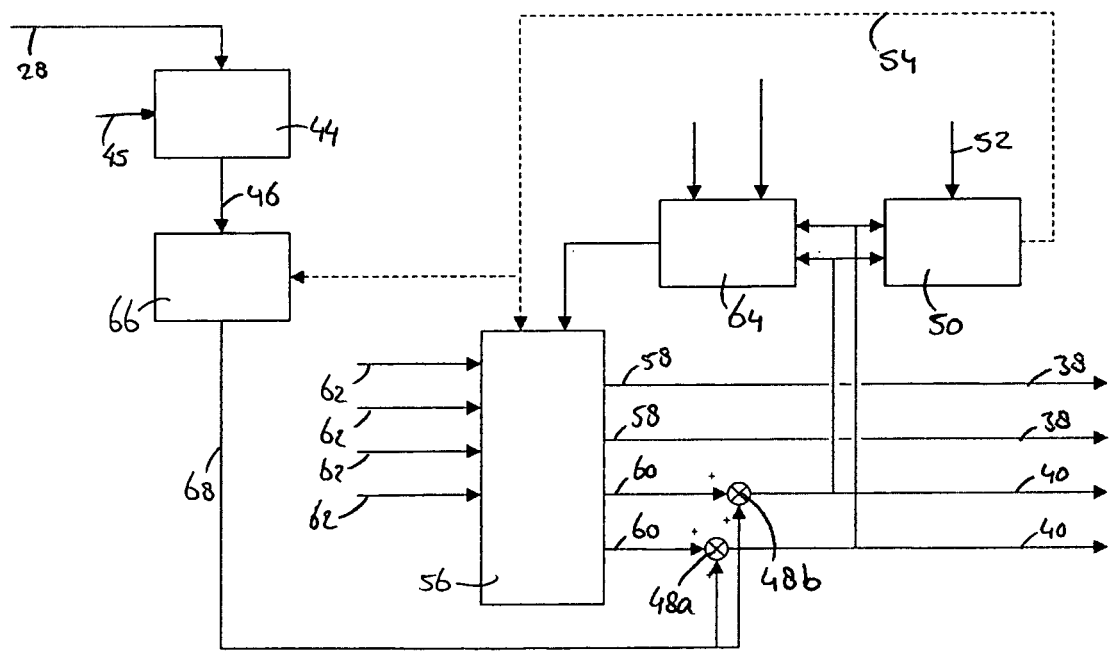
FIG. 6b illustrates a shuffle controller in accordance with an embodiment of the present invention for performing the shuffle and the slow shuffle sequence.

FIG. 6b illustrates a shuffle controller 36 according to the present invention configured to perform a slow shuffle sequence. Thereto an integrator is introduced into the shuffle controller 36 in comparison with FIG. 6a. The integrator 66 accumulates the actuator voltage 46 and outputs an integrated actuator voltage 68. Further, the integrator 66 has the shuffle start signal 54 as input. When the shuffle start signal 54 is input, the integrator 66 is reset setting its output to zero. With the integrated actuator voltage 68 set to zero the profile generator 56 may start to output a second shuffle control signal 60 starting at a level of the integrated actuator voltage 68 just before the integrator 66 was reset. Thus, a jump in the second control signal 40 is prevented.

While the profile generator 56 outputs the first and second shuffle control signals 58 and 60 according to the slow shuffle sequence, the position controller stays closed-loop and thus controlling the position of the object. Since the shuffle is performed slowly, this position control process does not need to be interrupted. Accordingly, the profile generator 56 does not output the shuffle event signal 42.

It is noted that the position control circuit as illustrated in FIG. 5b needs to be tuned differently when the integrator 66 is introduced in the shuffle controller 36. For example, if an integrator is present in the position controller 26 just before the output of the position controller 26, the integrator of the position controller 26 may be replaced by the integrator 66 in the shuffle controller 36. In other embodiments, however, the integrator 66 may be positioned at other nodes in the system.

While specific embodiments of the invention have been described above, it will be appreciated that the invention may be practiced otherwise than as described. The description is not intended to limit the invention.

What is claimed is:

1. A piezo actuating system for moving an object, comprising:
at least two piezo actuators, each of said at least two piezo actuators configured to lengthen or contract in response to a first control signal and to shear in a first direction or in a second direction opposite to said first direction in response to a second control signal; and
a control system for controlling said piezo actuators by supplying said first and second control signals;
wherein the system achieves the movement of said object by performing at least a linear shear sequence and a shuffle sequence, such that:
(a) said linear shear sequence moves said object by having each of said at least two piezo actuators (i) engage said object and (ii) shear from a first position to a second position along a first direction, and
(b) said shuffle sequence returns each of the at least two piezo actuators to the first position after moving said object by (i) releasing the engagement of one of the at least two piezo actuators with said object while maintaining the other of the at least two piezo actuators engaged with said object, (ii) changing a shear state of said one piezo actuator by shearing in a second direction opposite to said first direction, and (iii) engaging the object again using said one piezo actuator.

2. The system according to claim 1, wherein said other of the at least two piezo actuators performs said shuffle sequence after said one piezo actuator performs the shuffle sequence as said one piezo actuator has said object engaged.

3. The system according to claim 1, wherein each of the at least two piezo actuators is formed by two piezo sub-actuators positioned opposite to each other and said object is engaged through clamping said object between the two piezo sub-actuators.

4. The system according to claim 1, wherein the system is configured to alternate said linear shear sequence and said shuffle sequence to extend a range for moving said object.

5. The system according to claim 1, wherein said control system comprises a position controller and a shuffle controller for switching between said linear shear sequence and said shuffle sequence by supplying a shuffle event signal to said position controller and outputting said first and second control signals to each piezo actuator.

6. The system according to claim 5, wherein said shuffle controller comprises a shuffle arbiter that determines when a shuffle sequence is to be performed and a profile generator that generates the first and second control signals and the shuffle event signal.

7. The system according to claim 2, wherein the system is further configured to perform a slow shuffle sequence wherein said shuffle sequence is performed relatively slowly, and during which said linear shear sequence may be performed simultaneously.

8. The system according to claim 7, wherein the control system comprises an integrator having a control force signal as an input, said integrator being reset in response to a shuffle start control signal, and an output of said integrator being added to said second control signal.

9. A lithographic apparatus comprising:
an illumination system for providing a beam of radiation;
a support structure for supporting a patterning device that serves to impart said beam of radiation with a pattern in its cross-section;
a substrate holder for holding a substrate;
a projection system for projecting said patterned beam onto a target portion of the substrate; and
a piezo actuating system for moving a component of said lithographic apparatus, said piezo actuating system including:
at least two piezo actuators, each of said at least two piezo actuators configured to lengthen or contract in response to a first control signal and to shear in a first direction or in a second direction opposite to said first direction in response to a second control signal; and
a control system for controlling said piezo actuators by supplying said first and second control signals;
wherein the system achieves the movement of said object by performing at least a linear shear sequence and a shuffle sequence, such that:
(a) said linear shear sequence moves said object by having each of said at least two piezo actuators (i) engage said object and (ii) shear from a first position to a second position along a first direction, and
(b) said shuffle sequence returns each of the at least two piezo actuators to the first position after moving said object by (i) releasing the engagement of one of the at least two piezo actuators with said object while maintaining the other of the at least two piezo actuators engaged with said object, (ii) changing a shear state of said one piezo actuator by shearing in a second direction opposite to said first direction, and (iii) engaging the object again using said one piezo actuator.

10. The apparatus according to claim 9, wherein said other of the at least two piezo actuators performs said shuffle sequence after said one piezo actuator performs the shuffle sequence as said one piezo actuator has said object engaged.

11. The apparatus according to claim 9, wherein said piezo actuators are formed by two piezo sub-actuators positioned opposite to each other and said object is engaged through clamping said object between the two piezo sub-actuators.

12. The apparatus according to claim 9, wherein the system is configured to alternate said linear shear sequence and said shuffle sequence to extend a range for moving said object.

13. The apparatus according to claim 9, wherein said control system comprises a position controller and a shuffle controller for switching between said linear shear sequence and said shuffle sequence by supplying a shuffle event signal to said position controller and outputting said first and second control signals to each piezo actuator.

14. The apparatus according to claim 13, wherein said shuffle controller comprises a shuffle arbiter that determines when a shuffle sequence is to be performed and a profile generator that generates the first and second control signals and the shuffle event signal.

15. The apparatus according to claim 10, wherein the system is further configured to perform a slow shuffle sequence wherein said shuffle sequence is performed relatively slowly, and during which said linear shear sequence may be performed simultaneously.

16. The apparatus according to claim 15, wherein the control system comprises an integrator having a control force signal as an input, said integrator being reset in response to a shuffle start control signal, and an output of said integrator being added to said second control signal.

17. A method for moving an object using at least two piezo actuators, the piezo actuators being adapted for lengthening or contracting in response to a first control signal, and for shearing in two opposite directions in response to a second control signal, the method comprising:
(a) performing a linear shear sequence to move said object by having each of said at least two piezo actuators (i) engage said object and (ii) shear from a first position to a second position along a first direction; and
(b) performing a shuffle sequence to return at least one of the piezo actuators to the first position after moving said object by releasing the engagement of one of said piezo actuators with said object while maintaining the other of the piezo actuators engaged with said object, (ii) changing a shear state of said one piezo actuator by shearing said first piezo actuator an opposite direction from said first direction, and (iii) engaging said object again using said one piezo actuator.

18. The method according to claim 17, wherein while the one piezo actuator releases its engagement, said other piezo actuator performs said shuffle sequence after said one piezo actuator, as said first piezo actuator keeps engaging said object.

19. The method according to claim 17, further including alternating said linear shear sequence and said shuffle sequence to extend a range for moving said object.

20. The method according to claim 19, further including performing a slow shuffle sequence wherein said shuffle sequence is performed relatively slowly, and during which said linear shear sequence may be performed simultaneously.

21. A device manufacturing method employing a lithographic apparatus comprising:
providing an illumination system for providing a beam of radiation;
providing a support structure for supporting a patterning device that serves to impart said beam of radiation with a pattern in its cross-section;
providing a substrate holder for holding a substrate;

providing a projection system for projecting said patterned beam onto a target portion of the substrate; and moving a component of said lithographic apparatus by using at least two of piezo actuators, said piezo actuators being adapted for lengthening or contracting in response to a first control signal and for shearing in two opposite directions in response to a second control signal, said movement of component comprising:
  (a) performing a linear shear sequence to move said object by having each of said at least two piezo actuators (i) engage said object and (ii) shear from a first position to a second position along a first direction; and
  (b) performing a shuffle sequence to return at least one of the piezo actuators to the first position after moving said object by releasing the engagement of one of said piezo actuators with said object while maintaining the other of the piezo actuators engaged with said object, (ii) changing a shear state of said one piezo actuator by shearing said first piezo actuator an opposite direction from said first direction, and (iii) engaging said object again using said one piezo actuator.

22. The device manufacturing method according to claim 21, wherein while the one piezo actuator releases its engagement, said other piezo actuator performs said shuffle sequence after said one piezo actuator as said first piezo actuator keeps engaging said object.

23. The device manufacturing method according to claim 21, further including alternating said linear shear sequence and said shuffle sequence to extend a range for moving said object.

24. The device manufacturing method according to claim 23, further including performing a slow shuffle sequence wherein said shuffle sequence is performed relatively slowly, and during which said linear shear sequence may be performed simultaneously.

25. A piezo actuating system for moving an object, comprising
  a plurality of piezo actuators, each of said piezo actuators configured to lengthen or contract in response to a first control signal and to shear in a first direction or in a second direction opposite to said first direction in response to a second control signal; and
  a control system for controlling said piezo actuators by supplying said first and second control signals;
  wherein the system achieves the movement of said object by performing at least a linear shear sequence and a shuffle sequence, said linear shear sequence including engaging said object using at least one of said piezo actuators and moving said object by shearing said at least one piezo actuator in a first direction,
  wherein said shuffle sequence includes releasing the engagement of a first piezo actuator with said object, changing a shear state of said first piezo actuator by shearing said first piezo actuator in an opposite direction, and engaging the object again using said first piezo actuator, and
  wherein said control system comprises a position controller and a shuffle controller for switching between said linear shear sequence and said shuffle sequence by supplying a shuffle event signal to said position controller and outputting said first and second control signals to each piezo actuator.

26. A lithographic apparatus comprising:
an illumination system for providing a beam of radiation;
a support structure for supporting a patterning device that serves to impart said beam of radiation with a pattern in its cross-section;
a substrate holder for holding a substrate;
a projection system for projecting said patterned beam onto a target portion of the substrate; and
a piezo actuating system for moving a component of said lithographic apparatus, said piezo actuating system including:
  a plurality of piezo actuators, each of said piezo actuators configured to lengthen or contract in response to a first control signal and to shear in a first direction or in a second direction opposite to said first direction in response to a second control signal; and
  a control system for controlling said piezo actuators by supplying said first and second control signals;
  wherein the system achieves the movement of said object by performing at least a linear shear sequence and a shuffle sequence, said linear shear sequence including engaging said object using at least one of said piezo actuators and moving said object by shearing said at least one piezo actuator in a first direction,
  wherein said shuffle sequence includes releasing the engagement of a first piezo actuator with said object, changing a shear state of said first piezo actuator by shearing said first piezo actuator in an opposite direction, and engaging the object again using said first piezo actuator, and
  wherein said control system comprises a position controller and a shuffle controller for switching between said linear shear sequence and said shuffle sequence by supplying a shuffle event signal to said position controller and outputting said first and second control signals to each piezo actuator.

* * * * *